United States Patent
Chen et al.

(10) Patent No.: US 7,738,692 B2
(45) Date of Patent: Jun. 15, 2010

(54) METHODS OF DETERMINING QUALITY OF A LIGHT SOURCE

(75) Inventors: Nan-Jung Chen, Miaoli County (TW); Jui-Chung Peng, Hsin-Chu (TW); Kevin Hung, Chang Hua Hsien (TW); An-Kuo Yang, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 997 days.

(21) Appl. No.: 11/458,915

(22) Filed: Jul. 20, 2006

(65) Prior Publication Data

US 2008/0019586 A1 Jan. 24, 2008

(51) Int. Cl.
G06K 9/00 (2006.01)
G01C 3/14 (2006.01)
G06K 7/00 (2006.01)

(52) U.S. Cl. .................... 382/141; 356/12; 382/312

(58) Field of Classification Search ............ 382/141
See application file for complete search history.

(56) References Cited

U.S. PATENT DOCUMENTS

| | | |
|---|---|---|
| 4,545,683 A | 10/1985 | Markle |
| 4,607,356 A | 8/1986 | Bricot et al. |
| 4,701,050 A | 10/1987 | Oshida et al. |
| 4,744,071 A | 5/1988 | Bricot et al. |
| 5,406,543 A | 4/1995 | Kobayashi et al. |
| 5,432,588 A | 7/1995 | Kamon |
| 5,477,057 A | 12/1995 | Angeley et al. |
| 5,537,260 A | 7/1996 | Williamson |
| 5,541,026 A | 7/1996 | Matsumoto |
| 5,587,834 A * | 12/1996 | Noguchi ............... 359/558 |
| 5,677,755 A | 10/1997 | Oshida et al. |
| 5,706,091 A * | 1/1998 | Shiraishi .............. 356/399 |
| 5,774,222 A | 6/1998 | Maeda et al. |
| 5,808,724 A | 9/1998 | Ina et al. |
| 5,863,712 A | 1/1999 | Von Bunau et al. |
| 5,888,677 A | 3/1999 | Nakae |
| 6,198,793 B1 | 3/2001 | Schultz et al. |

(Continued)

FOREIGN PATENT DOCUMENTS

EP 1420297 A2 5/2004

(Continued)

OTHER PUBLICATIONS

NL Search Report and Written Opinion dated Feb. 11, 2008 regarding Dutch Patent Application No. 2000410. NL.

(Continued)

Primary Examiner—Vu Le
Assistant Examiner—Alex Liew
(74) Attorney, Agent, or Firm—Duane Morris LLP

(57) ABSTRACT

Methods for determining a quality of a light source applied to a photolithographic process are provided. An image sensor array is exposed to a light from a light source. Addresses and respective intensities corresponding to a plurality of locations on a pupil map representing intensity of the light from on the image sensor array. At least one of an inner curve and an outer curve of the pupil map is defined based upon the collected addresses and respective intensities. The light source is applied to a photolithographic process if the addresses have a predetermined pattern relative to the at least one of the inner curve and the outer curve.

16 Claims, 13 Drawing Sheets

U.S. PATENT DOCUMENTS

| | | | |
|---|---|---|---|
| 6,201,886 B1 * | 3/2001 | Nakayama | 382/124 |
| 6,263,099 B1 | 7/2001 | Maeda et al. | |
| 6,404,498 B1 | 6/2002 | Maeda et al. | |
| 6,549,272 B1 | 4/2003 | Chandhok et al. | |
| 6,567,155 B1 | 5/2003 | Chandhok et al. | |
| 6,700,649 B2 | 3/2004 | Chandhok et al. | |
| 6,744,505 B1 | 6/2004 | Wang et al. | |
| 7,030,966 B2 | 4/2006 | Hansen | |
| 2001/0046039 A1 | 11/2001 | Kudo | |
| 2001/0055098 A1 | 12/2001 | Chen | |
| 2002/0126267 A1 | 9/2002 | Smith | |
| 2002/0192578 A1 | 12/2002 | Tanaka et al. | |
| 2003/0215616 A1 | 11/2003 | Pierrat | |
| 2004/0156030 A1 | 8/2004 | Hansen | |
| 2004/0257543 A1 | 12/2004 | Dowski, Jr. et al. | |
| 2006/0114440 A1 * | 6/2006 | Sekigawa et al. | 355/69 |

FOREIGN PATENT DOCUMENTS

| | | |
|---|---|---|
| EP | 1473596 A3 | 6/2006 |
| JP | 2002025898 A | 1/2002 |
| JP | 2005353869 A | 12/2005 |

OTHER PUBLICATIONS

Office Action dated Dec. 15, 2009 in corresponding Taiwanese Application.

* cited by examiner

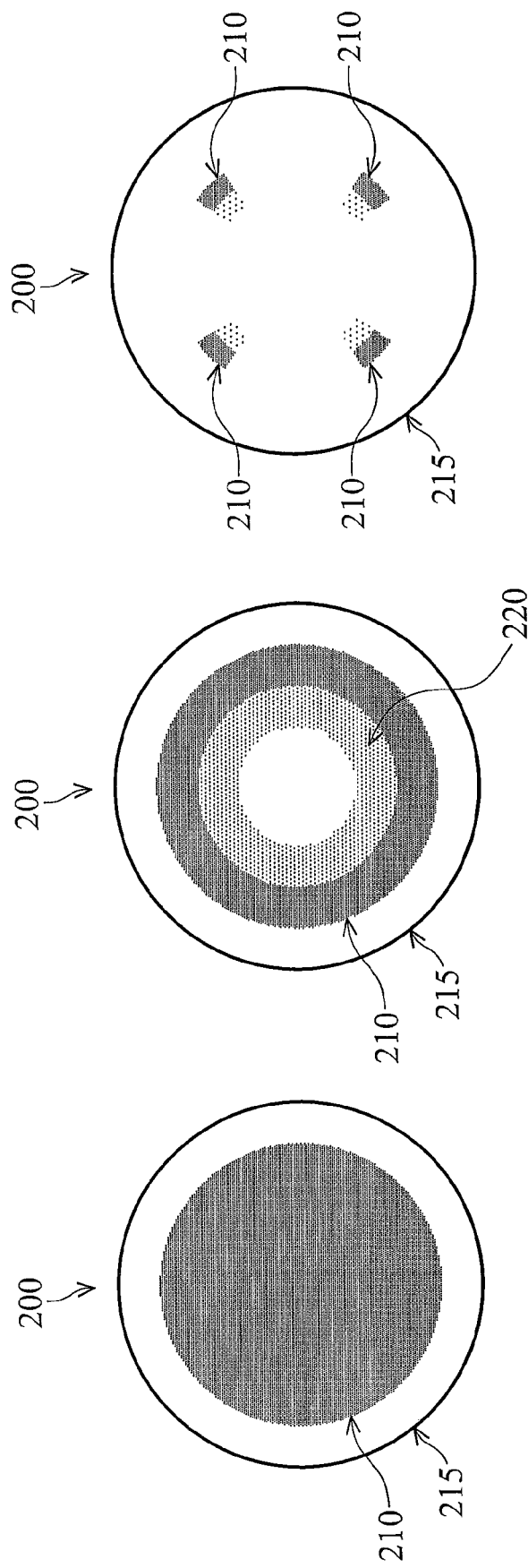

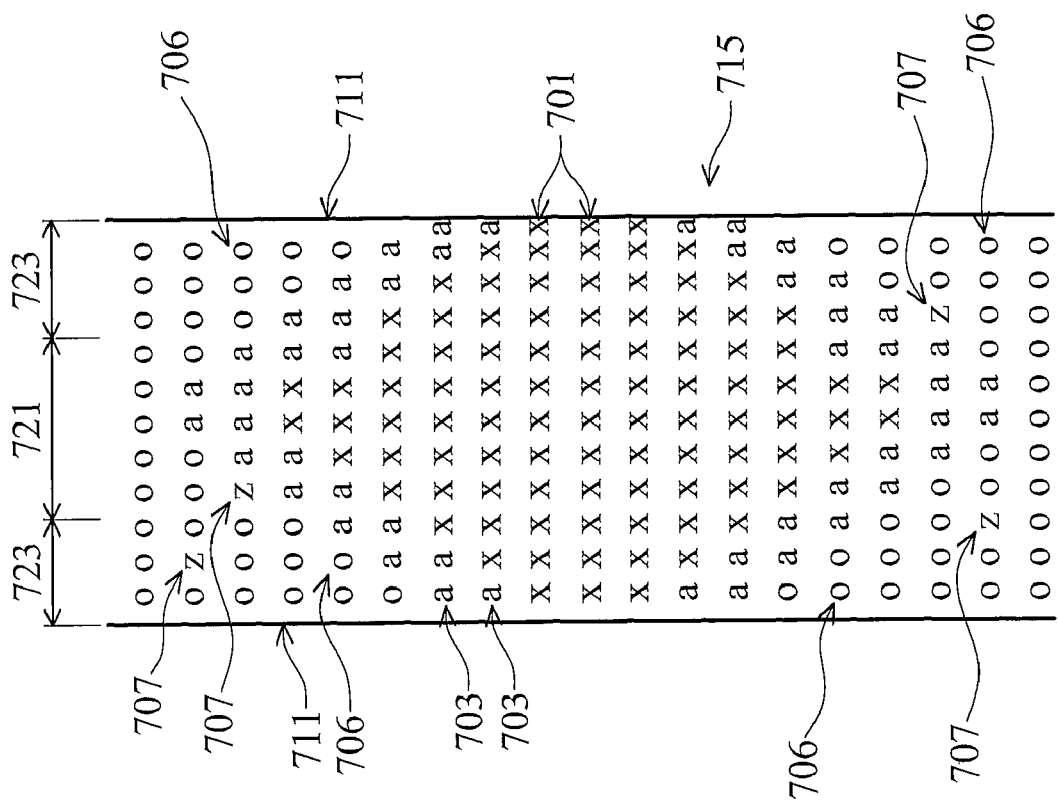

METHODS OF DETERMINING QUALITY OF A LIGHT SOURCE

BACKGROUND OF THE INVENTION

1. Field of the Invention

The present invention relates to methods of determining a quality of a light source, and more particularly related to methods of determining a quality of a light source applied to a photolithographic process.

2. Description of the Related Art

With advances of electronic products, semiconductor technology has been widely applied in manufacturing memories, central processing units (CPUs), display devices, light emitting diodes (LEDs), laser diodes and other devices or chip sets. In order to achieve high-integration and high-speed specifications, dimensions of semiconductor integrated circuits have been reduced and various materials and techniques have been proposed to achieve these targets and overcome obstacles during manufacturing. To scale down dimensions of integrated devices and circuits, photolithographic technology, e.g., exposing process, plays an important role.

The exposing process involves a light source which dominates the resolution of feature dimensions of integrated circuits. The desired resolution can be obtained by increasing the depth of focus (DOF) of the light source, the quality of the light source or other conditions of the exposing step. Accordingly, methods to determine the quality of the light source have been proposed.

FIGS. 1A and 1B are pictures of pupil maps. A pupil map is an image of light from a light source impinging on an image sensor array, used to determine whether the light source is acceptable to be applied to a photolithographic process. To generate the pupil maps, a light is provided from a light source module. The light passes through a shield and is projected on a charge-coupled device (CCD) array. The CCD array comprises a plurality of CCDs. Each of the CCDs senses a respective intensity (gray level value) and represents an address in the CCD array. Thus, the CCD array creates the image of the pupil map corresponding thereto.

Traditionally, an engineer or operator determines the quality of the light source based on visual inspection and personal experience. A skilled engineer or operator can distinguish the pupil map of FIG. 1A from the pupil map of FIG. 1B due to distortion, voids or discontinuity of the pupil map in FIG. 1B. The pupil map of FIG. 1A is acceptable, but the pupil map of FIG. 1B is not acceptable. The conditions of the light source module which generate the pupil map of FIG. 1B are modified to create a desirable pupil map. If distortions, voids and discontinuity of the pupil map are substantial, but not so serious that it is difficult to determine the quality of the light source, some undesirable pupil maps may be incorrectly determined to have acceptable quality. The conditions of the exposing step of such pupil maps are then used for performing a photolithographic process. Such conditions of the exposing step will generate undesired photolithographic patterns and affect subsequent processes.

From the foregoing, improved methods of determining the quality of a light source are desired.

SUMMARY OF THE INVENTION

In accordance with some exemplary embodiments, a method comprises the following steps. An image sensor array is exposed to a light from a light source. Addresses and respective intensities corresponding to a plurality of locations on a pupil map representing intensity of the light from on the image sensor array. At least one of an inner curve and an outer curve of the pupil map is defined based upon the collected addresses and respective intensities. The light source is applied to a photolithographic process if the addresses have a predetermined pattern relative to the at least one of the inner curve and the outer curve.

In accordance with some exemplary embodiments, a method comprises the following steps. An image sensor array is exposed to a light from a light source. Addresses and respective intensities corresponding to a plurality of locations on a pupil map representing intensity of the light from the light source on the image sensor array are collected. The collected intensities are added to calculate a total sum intensity. At least one of an inner curve and an outer curve of the pupil map is defined based upon the collected addresses and respective intensities, wherein the inner circle encloses a plurality of addresses corresponding to about 10% of the total sum intensity, and the outer circle encloses a plurality of addresses corresponding to about 90% of the total sum intensity. The light source is applied to a photolithographic process if the addresses have a predetermined pattern relative to the inner curve and the outer curve.

In accordance with some exemplary embodiments, a method comprises the following steps. An image sensor array is exposed to a light from a light source. Addresses and respective intensities corresponding to a plurality of locations on a pupil map representing intensity of the light from the light source on the image sensor array are collected. A plurality of segments are defined on the pupil map, wherein each segment comprises a plurality of addresses and respective normalized intensities. An outer curve is defined on the pupil map. An effective area of each of the segments is calculated. A number of the segments having effective areas that are larger than a first predetermined value is counted. The light source is applied to a photolithographic process, if the number of the segments having effective areas that are larger than the first predetermined value is larger than a second predetermined value.

The above and other examples will be better understood from the following detailed description of the preferred embodiments that is provided in connection with the accompanying drawings.

BRIEF DESCRIPTION OF THE DRAWINGS

Following are brief descriptions of exemplary drawings. They are mere exemplary embodiments and the scope of the present invention is not limited thereto.

FIGS. 2A-2C are images of different exemplary pupil maps.

FIG. 7C is a schematic drawing showing an exemplary enlarged first segment on the pupil map of FIG. 7B.

DESCRIPTION OF THE PREFERRED EMBODIMENT

Figure 1A:
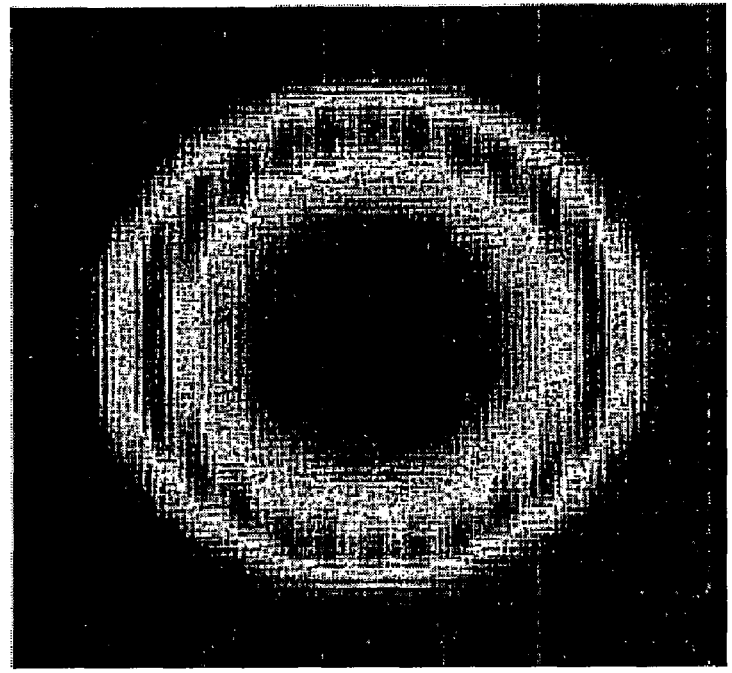
FIGS. 1A and 1B are images of pupil maps.
Figure 1B:
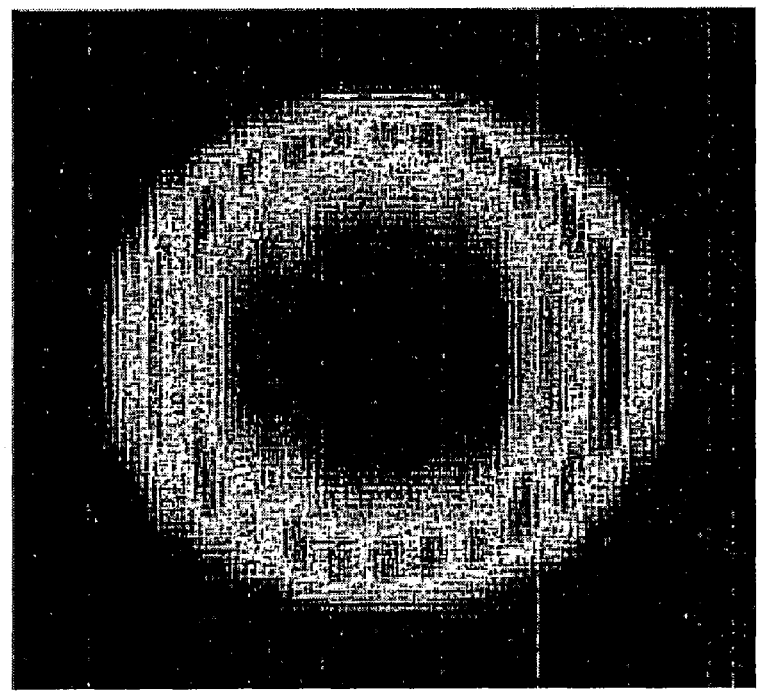

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

FIGS. 2A-2C are images of various exemplary pupil maps. Each pupil map represents a light from a light source that is detected by an imager array, such as a CCD array, a CMOS imaging sensor array, or the like. In FIGS. 2A-2C, the pupil maps 200 comprise a round pupil map in FIG. 2A, a ring pupil map in FIG. 2B and a pupil map with four light sections located at 45 degrees with respect to a horizontal axis in FIG. 2C. In other embodiments (not shown), the pupil map can be, for example, an oval pupil map, a substantially round pupil map or other pupil map with at least one light section located at any of various angles with respect to a horizontal axis. The pupil map in FIG. 2A has a light section 210 and a circle 215. The circle 215 indicates the maximum dimension to which the radius of the light section 210 can reach. The pupil map in FIG. 2B has a light section 210, a maximum dimension circle 215 and a shielded area 220. The shielded area 220 is formed when the light passes a round shield disposed between the source of light and a CCD array. The source of light with the donut-type pupil map improves the depth of focus (DOF) of the photolithographic process. The pupil map in FIG. 2C has four light sections 210 and a maximum dimension circle 215. The pupil map in FIG. 2C can be formed when the light passes a cross with a central round shield disposed between the source of light and a CCD array. The application of the source of light with the pupil map of FIG. 2C also improves the DOF of the photolithographic process. From the foregoing, one of ordinary skill in the art can readily select the type of pupil map for a desired photolithographic process by selecting a corresponding type of shield.

Figure 3:
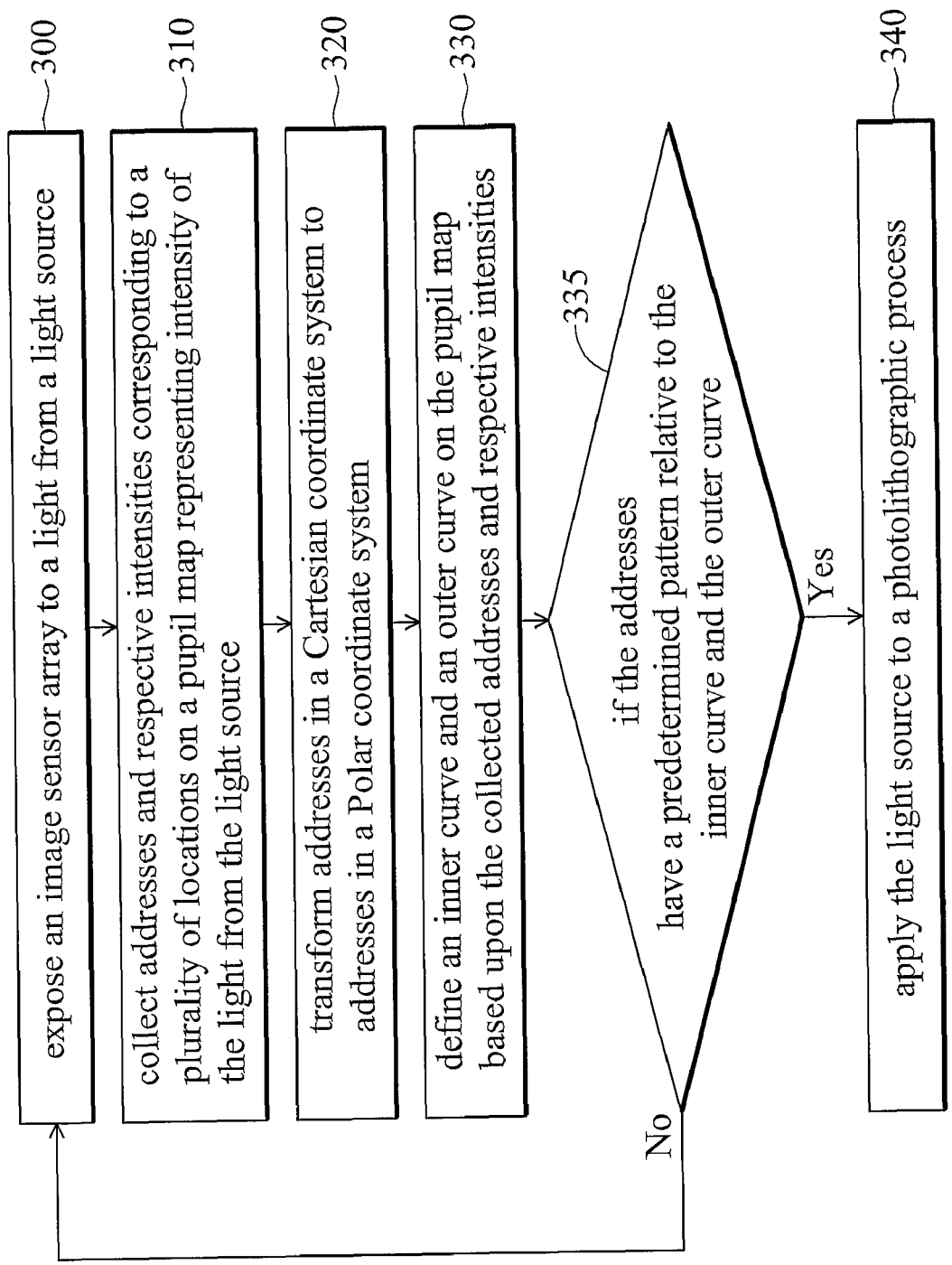
FIG. 3 is a flowchart of an exemplary method for determining a quality of a light source.

FIG. 3 is a flowchart of an exemplary method of determining the quality of a light source.

In step 300, the image sensor array is exposed to a light from a light source. Detailed descriptions are similar to those set forth in connection with FIGS. 2A-C.

In step 310, addresses and respective intensities corresponding to a plurality of locations on a pupil map representing intensity of the light from the light source are collected. The addresses represent locations of CCDs in the CCD array having respective intensities. The addresses may comprise, for example, addresses in a Cartesian coordinate system, addresses in a Polar coordinate system or addresses in other coordinate systems. In some embodiments, the addresses are addresses in a Cartesian coordinate system as shown in Table I.

TABLE I

| X (mm) | Y (mm) | Intensity (I) (a.u.) |
|---|---|---|
| −0.39851 | −0.971389 | 0.000175 |
| −0.373611 | −0.971389 | 0.000269 |
| −0.348704 | −0.971389 | 0.004330 |
| −0.323796 | −0.971389 | 0.009940 |
| −0.298889 | −0.971389 | 0.008340 |
| −0.273982 | −0.971389 | 0.002815 |
| −0.249074 | −0.971389 | 0.006727 |
| −0.224167 | −0.971389 | 0.009749 |

Table I shows a subset of the addresses having respective intensities along the Y-axis "−0.971389." In some embodiments, the center of the pupil is used as the center of the Cartesian coordinate system. Thus, negative addresses are included in the collected addresses. In some embodiments, intensities corresponding to the addresses are normalized during or after step 310 collects the addresses. It is noted that the number of addresses can be changed based on the resolution of the pupil map. If a pupil map having a high resolution is desired, more addresses and a high-pixel-count CCD array are used.

Figure 4B:
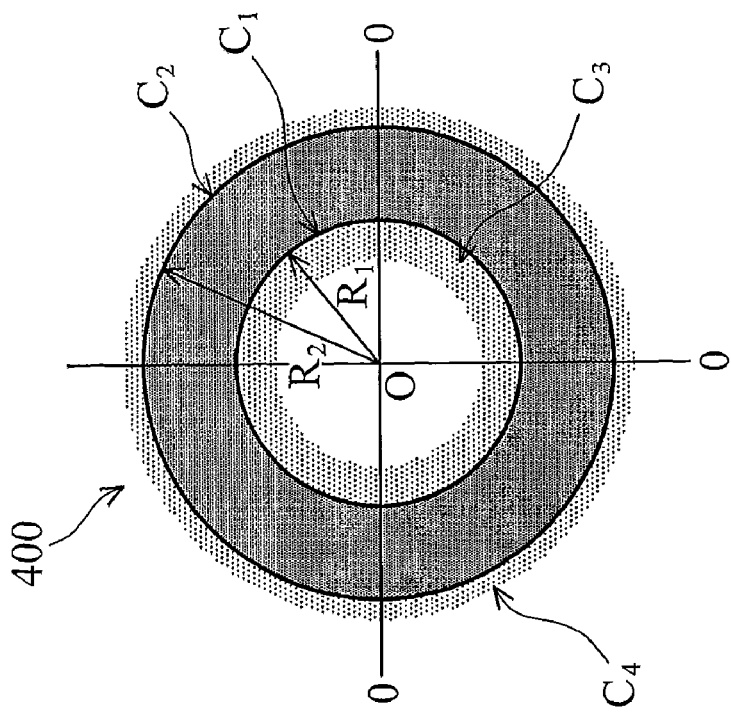
FIG. 4B is a drawing showing an exemplary pupil map with an inner circle and an outer circle thereon.
Figure 4A:
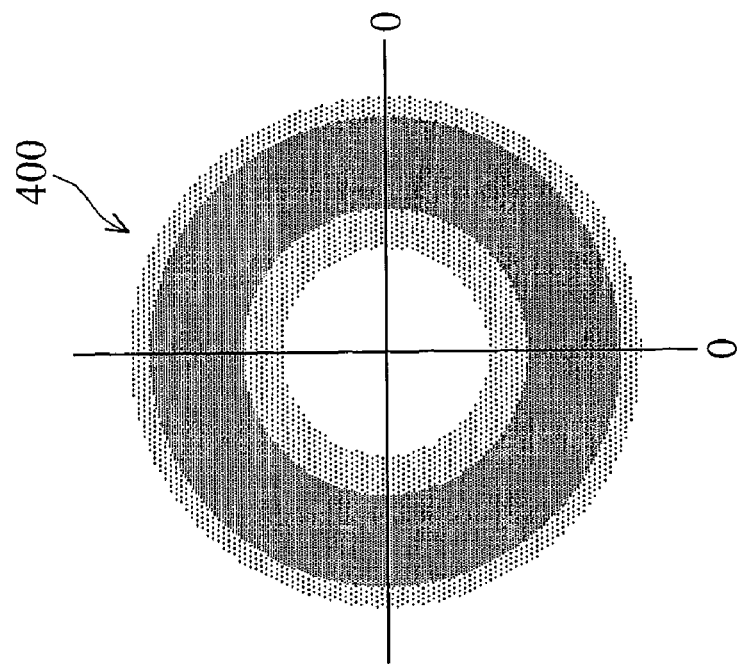
FIG. 4A is a drawing showing an exemplary pupil map after a coordination transformation.

Turn to FIG. 4A is a drawing showing an exemplary pupil map after a coordinate transformation.

Referring to FIG. 3, in step 320 addresses in a Cartesian coordinate system are transformed to addresses in a Polar coordinate system. The pupil map 400 comprises a plurality addresses having respective intensities. In some embodiments, the addresses collected in step 310 are addresses in a Cartesian coordinate system. For such embodiments, step 320 transforms the addresses from the Cartesian coordinate system having respective intensities $I(x, y)$ into addresses in a Polar coordinate system having respective intensity $I(r, \theta)$ by a coordination transformation method. For example, $I(0.5, 0.5)$ is transformed as $I(0.707, \pi/4)$. The transformation method can be, for example, a general method of coordinate transformation, such as $r = (x^2 + y^2)^{1/2}$ and $\theta = \tan^{-1}(y/x)$.

In some embodiments, the coordinate transformation step 320 set forth above is not used, if the addresses having the respective intensities collected in step 310 are already in the Polar coordinate system. With the address collection in a Polar coordinate system, subsequent steps 330 and 340 can be performed.

Turn to FIG. 4B is a drawing showing an exemplary pupil map with an inner circle and an outer circle thereon.

Referring to FIG. 3, after the address transformation step 330 defines an inner curve C1 and an outer curve C2 of the pupil map 400. In some embodiments, the inner curve C1 and outer curve C2 are circles as shown in FIG. 4B. The inner circle C1 has a radius R1, and the outer circle C2 has a radius R2. The radius R1 is the distance from the center "O" of the pupil map 400 to an address in the Polar coordinate system which has a value which may be from about 7.5% total sum intensity ($I_{sum}$) to about 12.5% $I_{sum}$. The outer circle C2 has a radius R2. The radius R2 is the distance from the center "O" of the pupil map to an address in the Polar coordinate system which has a value from about 87.5% $I_{sum}$ to about 92.5% $I_{sum}$. $I_{sum}$ can be determined by equation (1) below:

$$Isum = \sum_{\theta=0}^{2\pi} \sum_{r=0}^{\infty} I(r, \theta) \quad (1)$$

By obtaining the total sum intensity $I_{sum}$, an address, for example, with 10% total sum intensity $I_{sum}$ can be found. The address of I (r, θ) can be determined so as to satisfy equation (2) below:

$$\sum_{\theta=0}^{2\pi} \sum_{r=0}^{R1} I(r, \theta) = Isum/10 \quad (2)$$

For example, if equation (2) provides that the address of the 10% $I_{sum}$ is (0.55061, 3/4π), the radius R1 is 0.55061. The inner circle C1 is then defined on the pupil map based on the radius R1 as shown in FIG. 4B.

By obtaining the total sum intensity $I_{sum}$, the address, for example, with 90% total sum intensity $I_{sum}$ can be found. The address of I (r, θ) can be determined based on equation (3) below:

$$\sum_{\theta=0}^{2\pi} \sum_{r=0}^{R2} I(r, \theta) = 0.9 * Isum \quad (3)$$

If equation (3) provides that the address of the 90% $I_{sum}$ is (0.88428, 7/8π), the radius R2 is 0.88428. The inner circle C1 and outer circle C2 are then defined on the pupil map 400 based on the radii R1 and R2 as shown in FIG. 4B.

In FIG. 4B, the pupil map 400 also shows a plurality of intensity contour lines C3 and C4, which are adjacent to the inner circle C1 and the outer circle C2, respectively. The intensity contour lines C3 and C4 are provided to determine the quality of the light source.

Figure 5B:
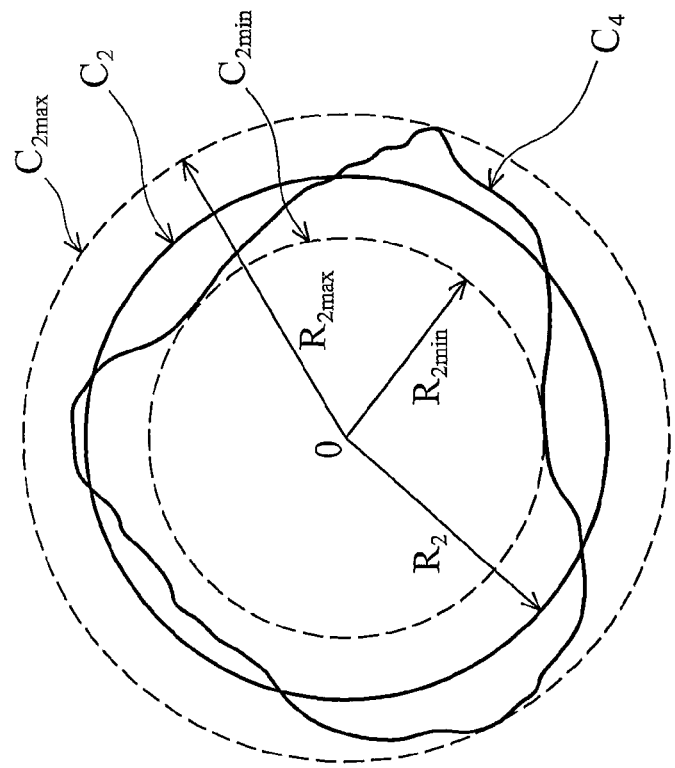
FIG. 5B is a schematic drawing showing a relationship between the outer circle C2 and the intensity contour line C4 of FIG. 4B.
Figure 5A:
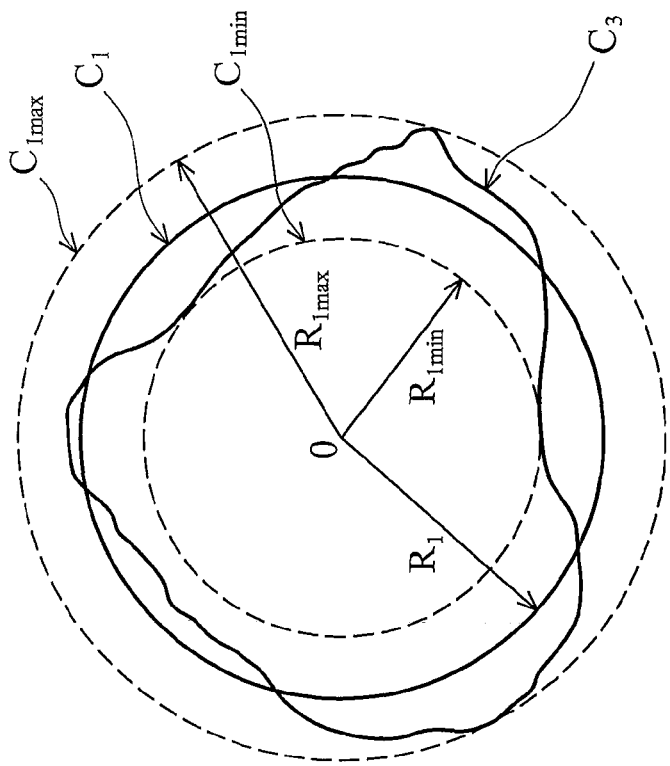
FIG. 5A is a schematic drawing showing a relationship between the inner circle C1 and the intensity contour line C3 of FIG. 4B.

FIG. 5A is a schematic drawing showing a relationship between the inner circle C1 and the intensity contour line C3 of FIG. 4B.

In some embodiments, the inner circle C1 has the radius R1 which is the distance from the center "O" of the pupil map to the address in the Polar coordinate system having a value of about 10% $I_{sum}$. The intensity contour line C3 represents a curve formed by the locus of addresses having about 10% of the normalized intensity. The radii R1max and R1min are distances from the center "O" of the pupil map to the addresses in the Polar coordinate system corresponding to about 7.5% $I_{sum}$ and about 12.5% $I_{sum}$, respectively. The circles C1max and C1min are defined corresponding to the radii R1max and R1min, respectively. The circle C1min encloses a plurality of addresses having about 7.5% $I_{sum}$. The circle C1max encloses a plurality of addresses having about 12.5% $I_{sum}$. If the addresses corresponding to about 10% of the normalized intensity substantially falls within the region defined between the circles C1max and C1min, it is determined that the quality of the light source is acceptable. Under this circumstance, step 335 is satisfied and the light source is applied to a photolithographic process in step 340 as shown in FIG. 3. A semiconductor wafer is fabricated by the photolithographic process. On the contrary, if the addresses corresponding to about 10% of the normalized intensity do not substantially fall within the region defined between the circles C1max and C1min, the quality of the light source should be improved and step 335 is not satisfied as shown in FIG. 3. Under this circumstance, a modified light source is applied and steps 300-335 are repeated to determine the quality of the light source as shown in FIG. 3.

In some embodiments, it is not necessary to obtain both of the circles C1max and C1min to determine the quality of the light source. For example, if addresses on the inner circle C1 correspond to intensities having an equal or proximately equal normalized intensities, the quality of the light source is determined to be acceptable and steps 335 and 340 shown in FIG. 3 can be performed as set forth above.

In some embodiments, only one of the circles C1max and C1min is used to determine the quality of the light source. In some embodiments, if the addresses corresponding to about 10% of the normalized intensity falls within the circle C1max, the quality of the light source is determined to be acceptable and steps 335 and 340 shown in FIG. 3 can be performed as set forth above. In some embodiments, if the addresses corresponding to about 10% of the normalized intensity falls outside the circle C1min, the quality of the light source is determined to be acceptable and steps 335 and 340 shown in FIG. 3 can be performed as set forth above.

FIG. 5B is a schematic drawing showing a relationship between the outer circle C2 and the intensity contour line C4 of FIG. 4B.

In some embodiments, the outer circle C2 has the radius R2 which is the distance from the center "O" of the pupil map to the address in the Polar coordinate system corresponding to about 90% $I_{sum}$. The intensity contour line C4 is formed by addresses corresponding to about 90% normalized intensity. The radii R2max and R2min are distances from the center "O" of the pupil map to the address in the Polar coordinate system corresponding to about 87.5% $I_{sum}$ and about 92.5% $I_{sum}$, respectively. The circles C2max and C2min correspond to the radii R2max and R2min, respectively. The circle C2min encloses a plurality of addresses having about 87.5% $I_{sum}$. The circle C2max encloses a plurality of addresses having about 92.5% $I_{sum}$. If the addresses corresponding to about 90% of the normalized intensity substantially fall within the region defined between the circles C2max and C2min, the quality of the light source is determined to be acceptable. Under this circumstance, step 335 is satisfied and the light source is applied to a photolithographic process in step 340 as shown in FIG. 3. Conversely, if the addresses corresponding to about 90% of the normalized intensity do not substantially fall within the region defined between the circles C2max and C2min, the quality of the light source should be improved and step 335 is not satisfied as shown in FIG. 3. Under this circumstance, a modified light source is applied and steps 300-335 are repeated to determine the quality of the light source as shown in FIG. 3.

In some embodiments, it is not necessary to obtain both of the circles C2max and C2min to determine the quality of the light source. For example, if addresses on the outer circle C2 corresponding to intensities having an equal or substantially similar normalized intensities, the quality of the light source is determined to be acceptable and steps 335 and 340 shown in FIG. 3 can be performed as set forth above.

In some embodiments, only one of the circles C2max and C2min is used to determine the quality of the light source. In some embodiments, if the addresses corresponding to about 90% of the normalized intensity falls within the circle C2max, the quality of the light source is determined to be acceptable and steps 335 and 340 shown in FIG. 3 can be performed as set forth above. In some embodiments, if the addresses corresponding to about 90% of the normalized intensity falls outside the circle C2min, the quality of the light source is determined to be acceptable and steps 335 and 340 shown in FIG. 3 can be performed as set forth above.

The circles C1 and C2 corresponding to areas enclosing 10% $I_{sum}$ and 90% $I_{sum}$, respectively, are merely exemplary values. The present invention is not limited thereto. One skilled in the art can readily select the circles C1 and C2 corresponding to different percentages of the total sum intensity ($I_{sum}$) based on a desired quality of the light source.

It is noted that the inner circle C1, the outer circle C2 or both are used, if a desired quality of the light source can be determined. For example, the quality of the light source generating the pupil maps FIGS. 2A and 2C can be determined by using either one or both of circles C1 and C2. The quality of the light source that generates the pupil map FIG. 2B can be determined by using the outer circle C2 alone, without requiring the inner circle. Based on the description above, one of ordinary skill in the art can readily use the inner circle C1, the outer circle C2 or both to obtain a desired quality of the light source.

In some embodiments, curves such as a circle, an oval, a part of a circle or other curve that is adapted to define a boundary to determine the quality of the light source may be used. For example, the pupil map FIG. 2C has four light sections. Portions of the circles C1 and C2 are sufficient to determine the quality of the light source. One skilled in the art thus can readily modify or select the shape of the curve to determine the quality of the light source.

Following is a description of another exemplary method to determine a quality of a light source.

Figure 6A:
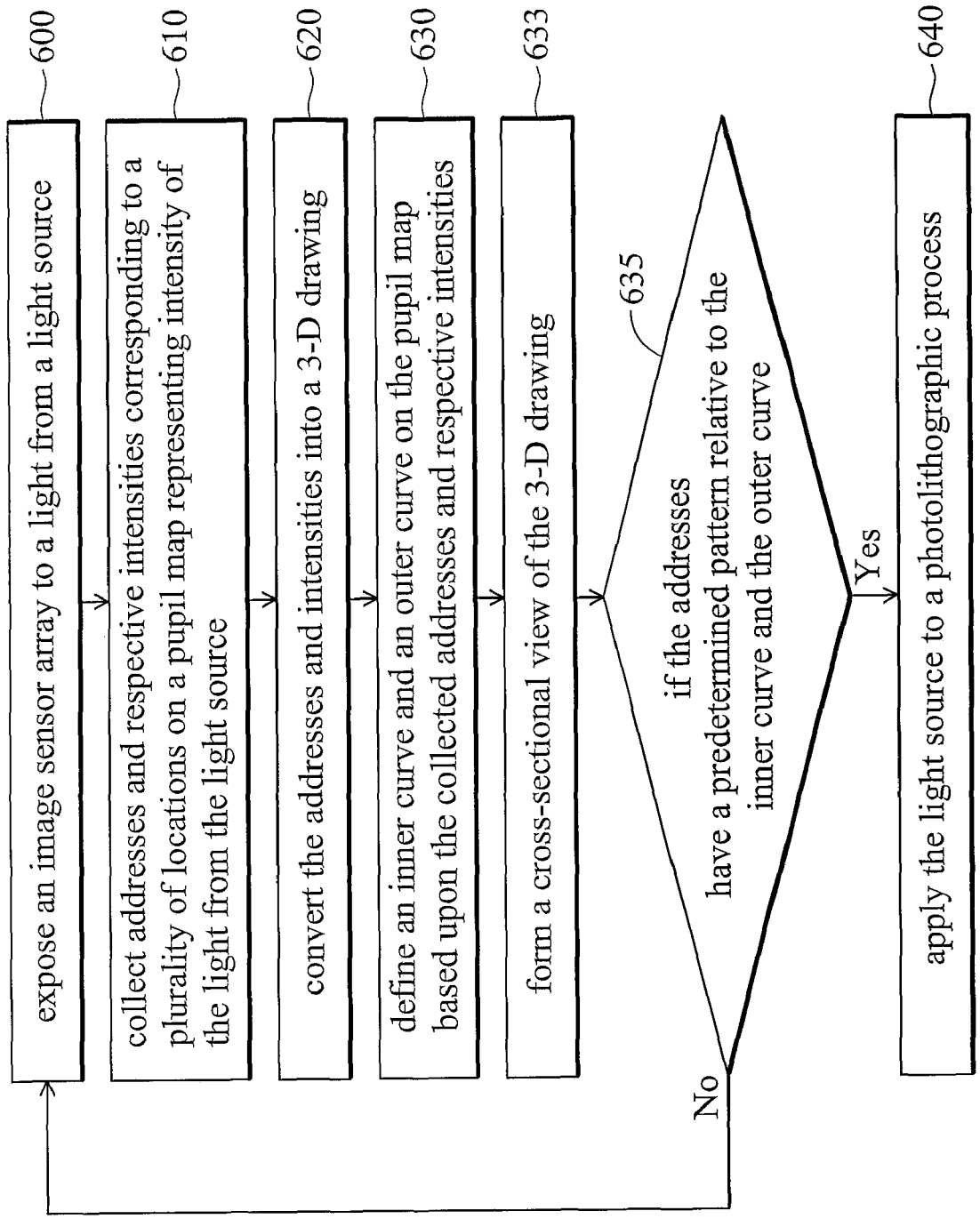
FIG. 6A is a flowchart showing an exemplary method to determine a quality of a light source.

FIG. 6A is a flowchart showing an exemplary method to determine a quality of a light source.

A semiconductor wafer is fabricated by the photolithographic process. In FIG. 6A steps 600, 610, 630, 635 and 640 are like items indicated by reference numerals having the same value as in FIG. 3, increased by 300. Thus, these items in FIG. 6A can be the same as corresponding items described above with reference to FIG. 3, and a description of these items is not repeated.

Figure 6B:
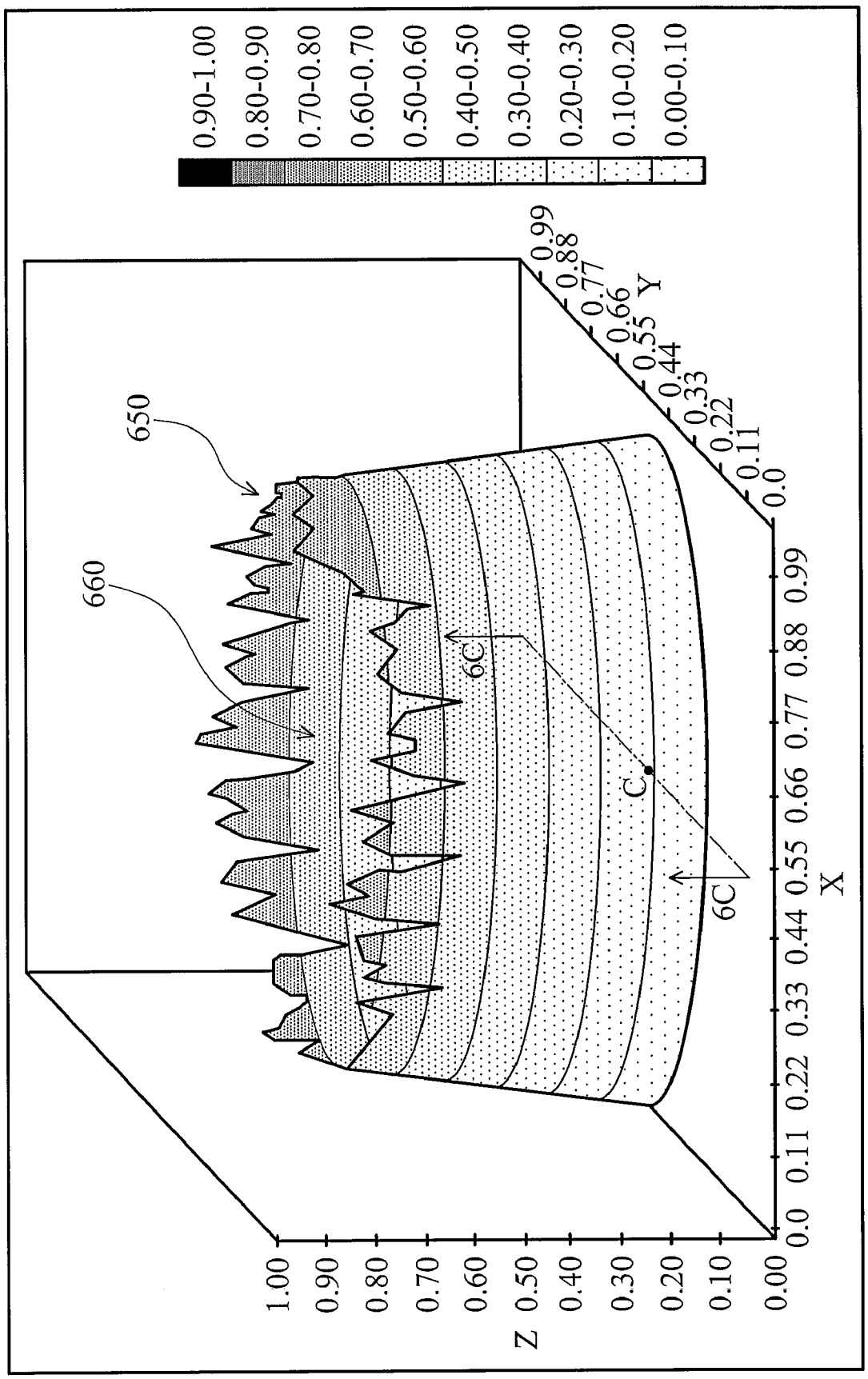
FIG. 6B is a schematic drawing of an exemplary 3-D pupil map.

After step 610, step 620 converts the addresses and intensities into a 3-D drawing as shown in FIG. 6B. In FIG. 6B, the 3-D drawing comprises address coordinates X and Y, and the intensity coordinate Z.

The address coordinates X and Y can be, for example, Cartesian coordinates or Polar coordinates. In some embodiments, intensities at the various addresses are normalized in the 3-D pupil map 650. In some embodiments, the addresses and respective intensities of the pupil map in FIG. 2B are used to generate the 3-D pupil map 650. The 3-D pupil map 650 thus comprises a hollow region 660 therein, which represents the shield region 220 shown in FIG. 2B.

Figure 6C:
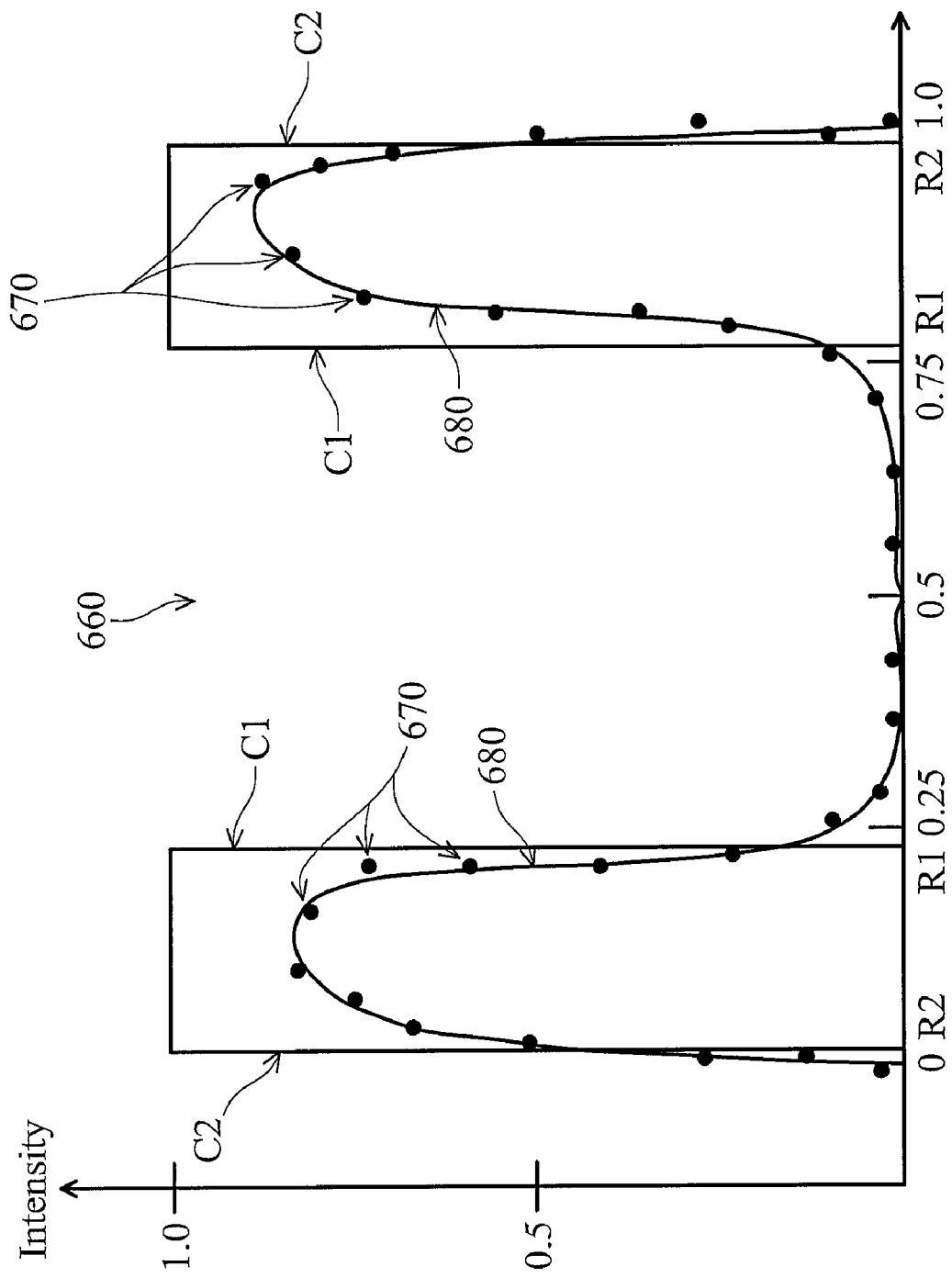
FIG. 6C is a cross-sectional view along section line 6C-6C through the center of the pupil map of FIG. 6B.

After step 630, step 633 forms a cross-sectional view of the 3-D pupil map 650 and creates the drawing as shown in FIG. 6C. FIG. 6C is a cross-sectional view along section line 6C-6C through the center "C" of the 3-D pupil map 650 of FIG. 6B. In FIG. 6C, C1 and C2 represent the circles set forth in connection with FIGS. 5A and 5B. Dots 670 show the normalized intensities of the addresses of the 3-D pupil map 650 along section line 6C-6C. The curve 680 is contoured to pass through or adjacent to the dots 670 by a polynomial regression method. In some embodiments, the curve 680 is, for example, a parabola. If substantially all of the dots 670 fall on or are near to the curve 680, then the light source has at least the desired quality. As shown in FIG. 6C, the dots 670 either fall on or slightly deviate from the curve 680. Under this circumstance, step 635 is satisfied and the light source is applied to a photolithographic process in step 640 as shown in FIG. 6A. Conversely, if a substantial number of the dots 670 do not fall on or near to the curve 680, the quality of the light source should be improved and step 635 is not satisfied as shown in FIG. 6A. Under this circumstance, a modified light source is applied and steps 600-635 are repeated to determine the quality of the light source as shown in FIG. 6A.

Figure 7A:
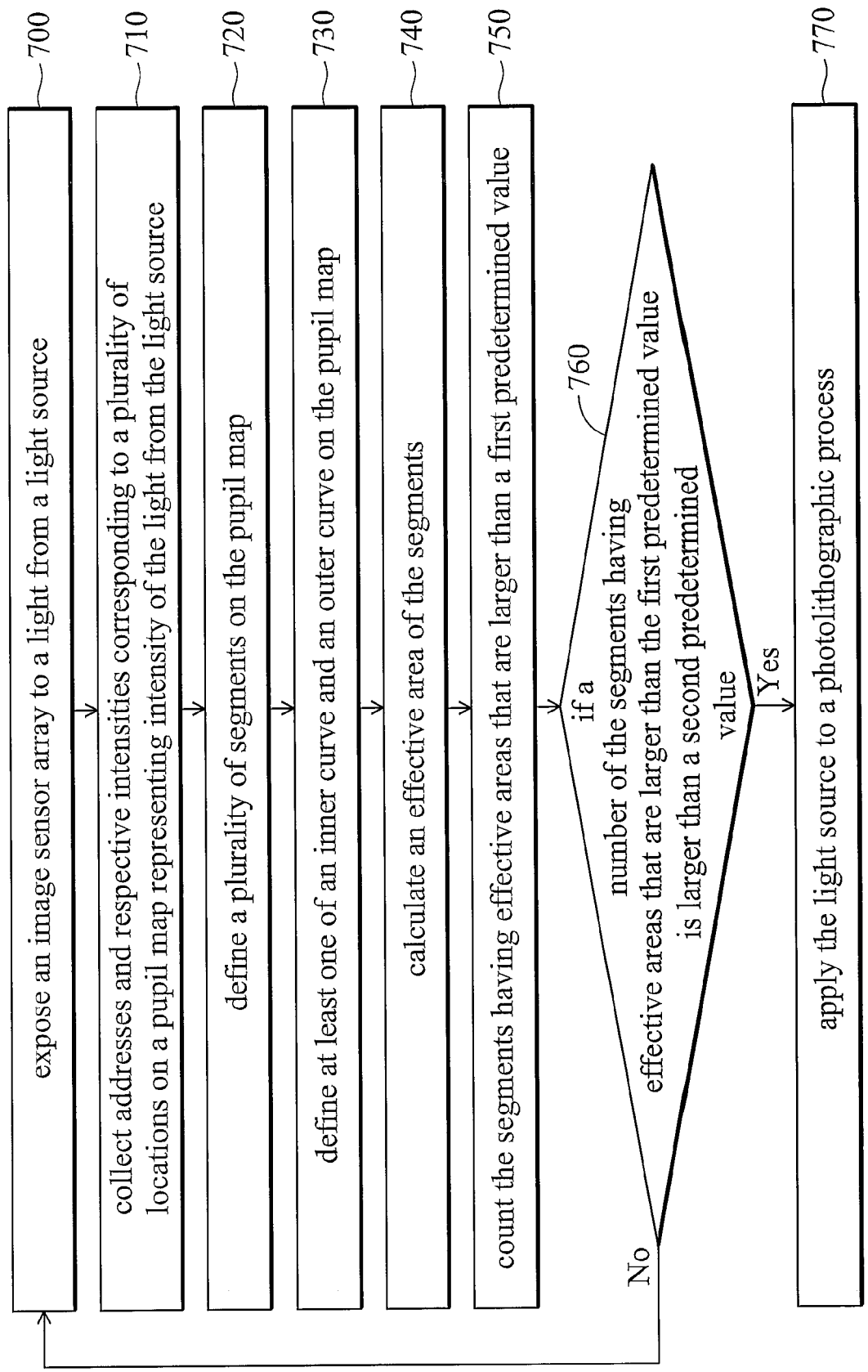
FIG. 7A is a flowchart showing an exemplary method of determining a quality of a light source.
Figure 7B:
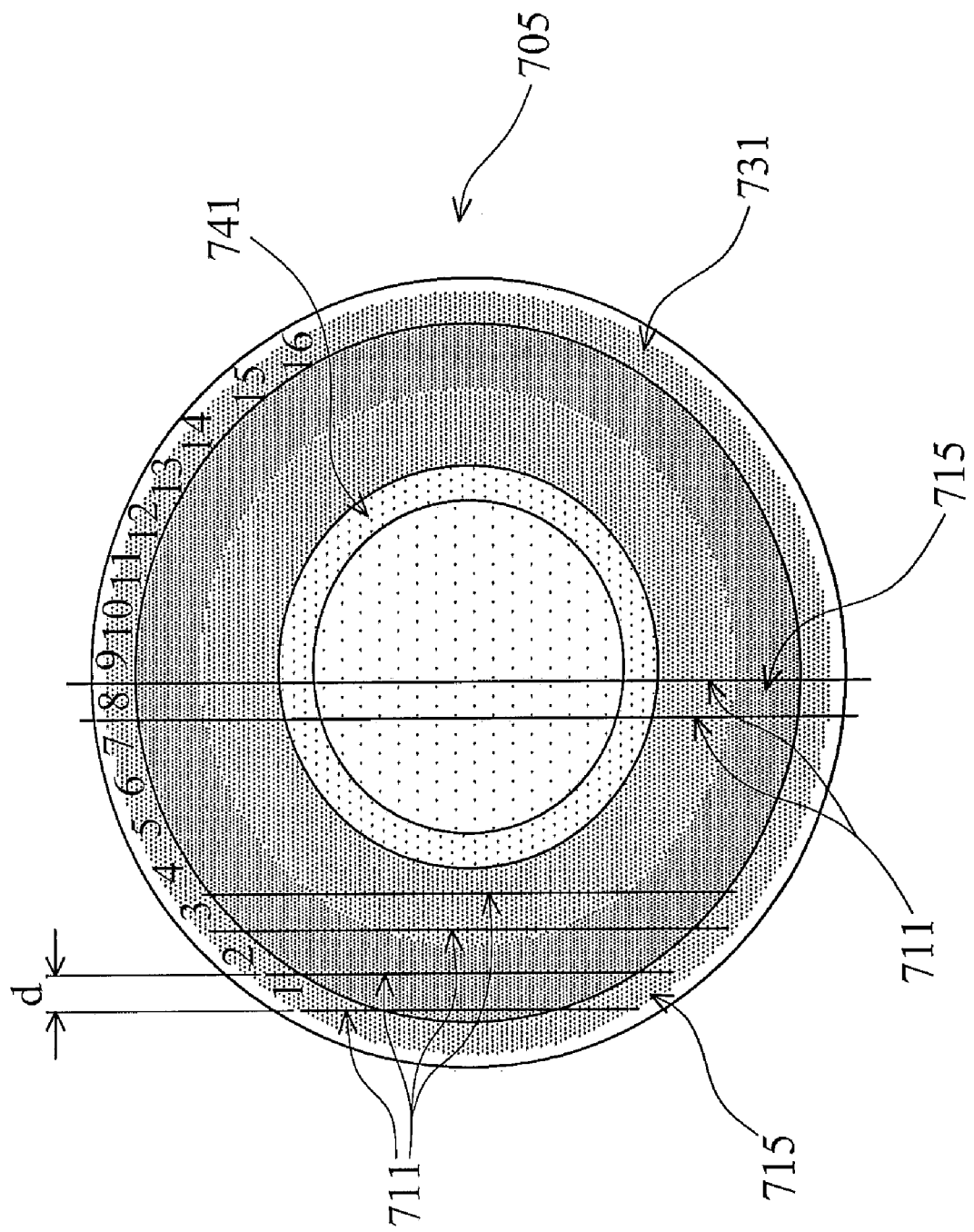
FIG. 7B is a schematic drawing showing segments divided on the pupil map.

FIG. 7A is a flowchart showing an exemplary method of determining the quality of a light source. FIG. 7B is a schematic drawing showing the pupil map divided into segments. FIG. 7C is a schematic drawing showing an exemplary enlarged first segment on the pupil map of FIG. 7B.

Following is a description of an exemplary method of determining the quality of a light source.

A semiconductor wafer is fabricated by the photolithographic process. In FIG. 7A steps 700, 710 and 770 are like items indicated by reference numerals 300, 310 and 340 in FIG. 3, respectively. Thus, these items in FIG. 7A can be the same as corresponding items described above with reference to FIG. 3, and a description of these items is not repeated.

Step 720 defines a plurality of segments on the pupil map 705 as shown in FIG. 7B. The pupil map 705 is divided into a plurality of segments 715, which are separated by boundary lines 711. The segments 715 have substantially the same width "d." Steps of defining a segment are described below and referenced to FIG. 7C.

FIG. 7C is a schematic drawing showing the first segment 715 of the pupil map 705 of FIG. 7B. The gray level on the pupil map 705 is represented by intensities at addresses on the pupil map 705. In FIG. 7C, "x" represents first addresses 701 corresponding to normalized intensities more than about 0.3; "a" represents second addresses 703 corresponding to normalized intensity less than about 0.3, "o" represents the addresses 706 corresponding to normalized intensity which is zero, and "z" represents the addresses 707 corresponding to normalized intensities more than about 0.9. In some embodiments, the segment 715 comprises a central region 721 and boundary regions 723. The central region 721 has more first addresses 701, i.e., "x", than the number of first addresses 701 of each of the boundary regions 723. The boundary lines 711 are defined based on a periodic profile of distribution of the first addresses 701, "x". In some embodiments, the boundary lines 711 are defined at the place where the boundary regions 723 have the fewest first addresses 701 "x". In other embodiments, the boundary lines 711 are defined at the central region 721 corresponding to the most first addresses 701 "x". Accordingly, one of ordinary skill in the art, based on these embodiments, can readily understand that the boundary lines 711 can be located at the place where a predetermined one segment of the periodic profile of the distribution of the first addresses is found.

It is also noted that FIG. 7C is merely a schematic drawing. The central region 721 does not necessarily include 5 columns of addresses, and each of the boundary regions 723 does not necessarily comprise 3 columns of addresses. The number of columns may be selected for any given embodiment. In some embodiments, the central region 721 can be the central column of addresses, and the boundary regions 723 can be the columns of addresses immediately adjacent to the boundary lines 711.

Figure 7D:
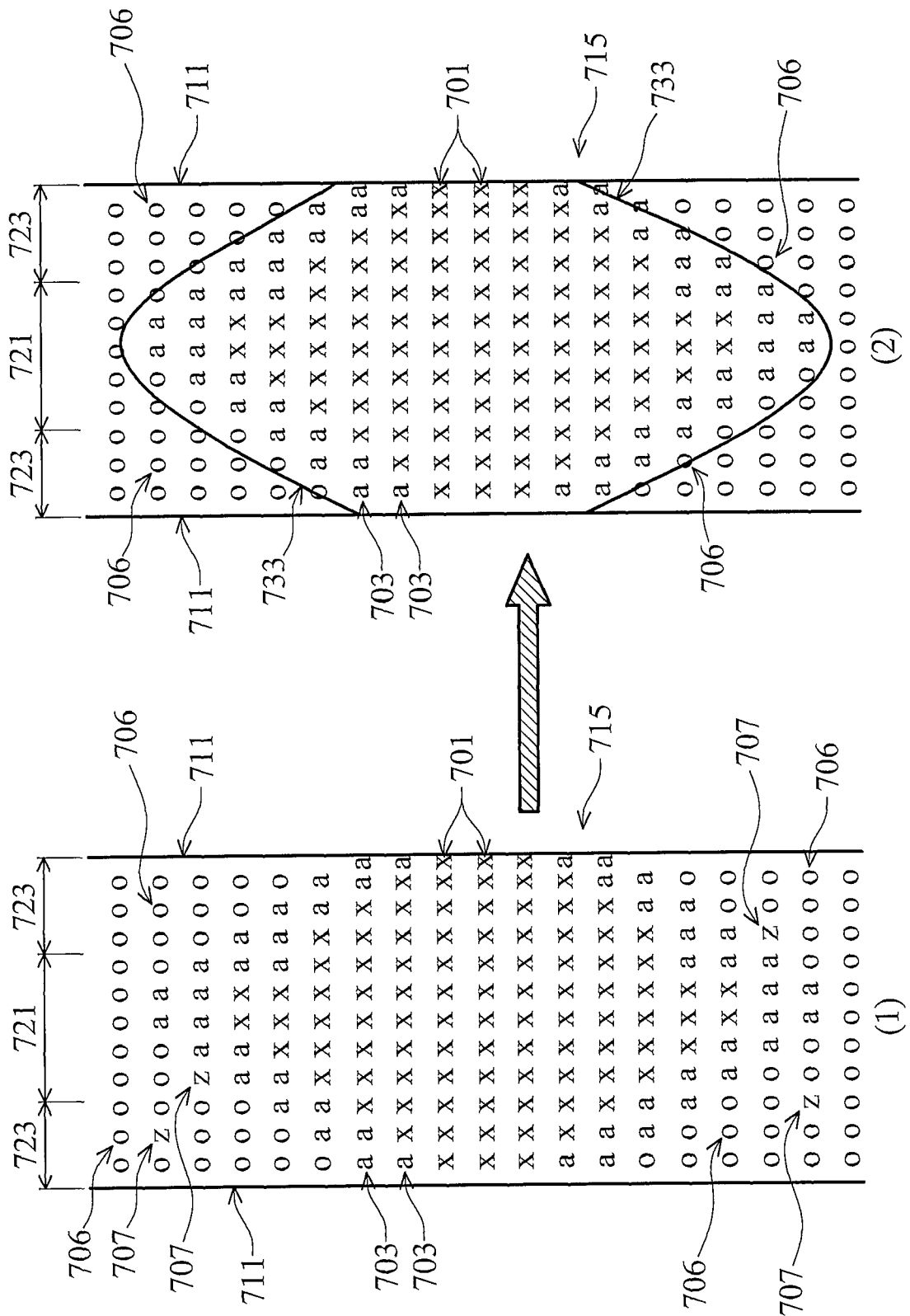
FIG. 7D is a schematic drawing showing a transformation described in step 730.

FIG. 7D is a schematic drawing showing an exemplary transformation of a segment of a pupil map described in step 730. In this step, outer curves 733 of the pupil map 705 are defined.

Referring to FIG. 7B, step 730 collects the addresses of the first segment 715 of the pupil map 705 within the edge region 731 having corresponding intensities. The addresses within the edge region 731 comprise addresses with intensities represented by "x", "a", "o" and "z", which have the same definitions as discussed above, as shown in FIG. 7D(1). In some embodiments, all of the addresses within the pupil map 705 are collected. However, in other embodiments only addresses within the edge region 731 are collected to reduce the process time of step 730.

Step 730 then defines normalized intensities at the addresses as zero when the addresses are outside a region formed by the first addresses 701, "x" and have normalized intensities larger than about 90%. As mentioned above, "z" represents the addresses 707 corresponding to intensities more than about 90%. The intensities at the addresses 707 "z" shown in FIG. 7D (1) result from noise and should be eliminated in order to avoid confusion on the pupil map 705. The intensities of addresses 707 thus are defined as zero, and "z" is replaced by "o" as shown in FIG. 7D(2).

Referring to FIG. 7D (2), after the transformation the outer curves 733 is formed by lining addresses which have intensities "0" and immediately adjacent to the addresses 703, i.e., "a", of the pupil map 705.

Figure 7E:
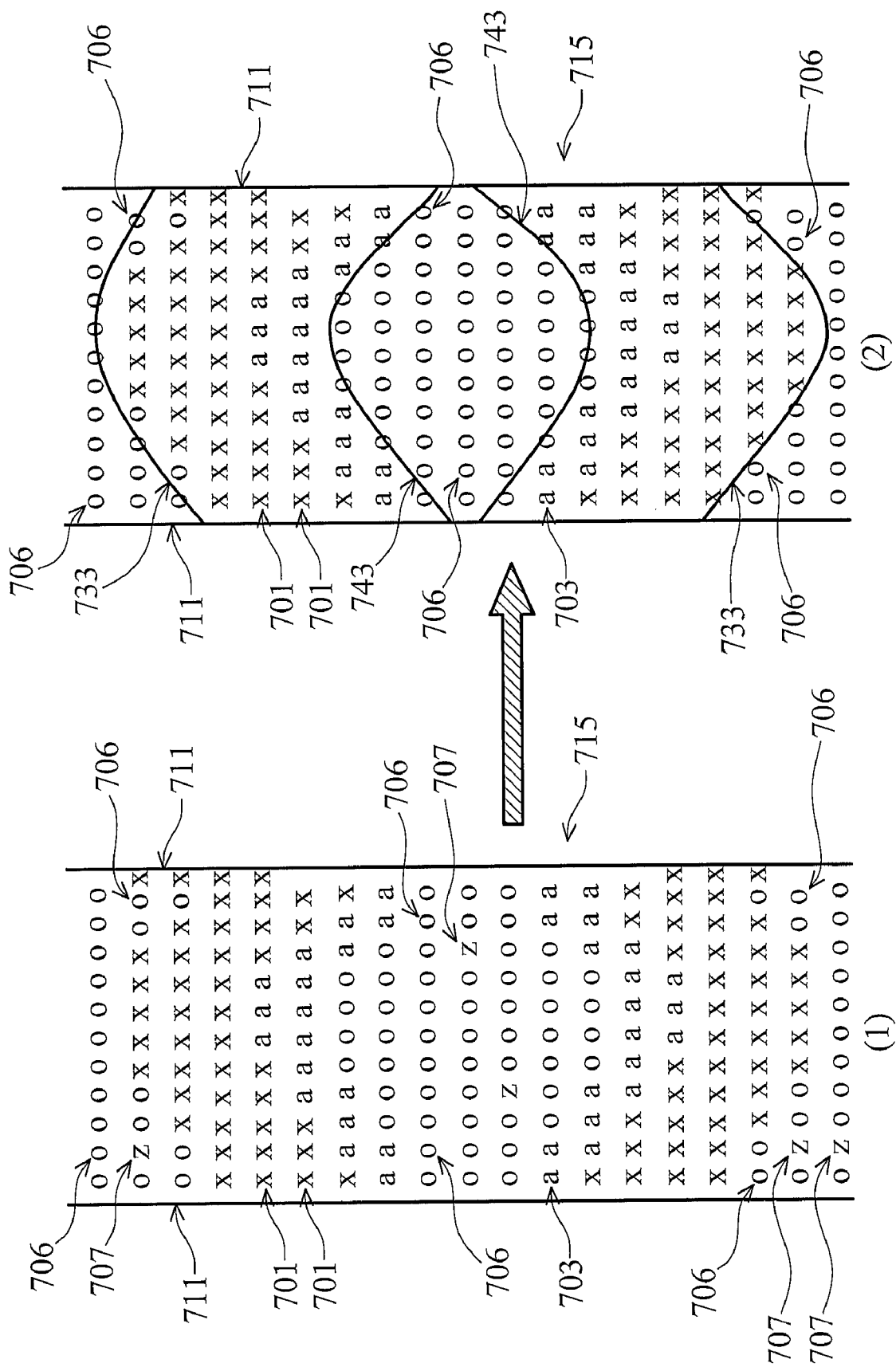
FIG. 7E is a schematic drawing showing a transformation described in step 730.

In some embodiments, step 730 also defines an inner curve 743 on the pupil map 705. FIG. 7E is a schematic drawing showing a transformation of a segment of a pupil map described in step 730.

In step 730, the addresses of the pupil map 705 within another edge region 741 having corresponding intensities shown in FIG. 7B are collected. The addresses within the edge region 741 comprise addresses with intensities represented by "x", "a", "o" and "z", which have the same definition as discussed above, as shown in FIG. 7E (1). Detailed descriptions of these items are not repeated. In some embodiments, all of the addresses within the pupil map 705 are collected. However, in other embodiments only addresses within the edge region 741 are collected to reduce the process time of step 730.

Step 730 then defines corresponding intensities at the addresses as having a value of zero when the addresses are outside a region formed by the first addresses 701 "x" and have normalized intensities larger than about 90%. As mentioned above, "z" represents the addresses 707 corresponding to intensities more than about 90%. The intensity values at the addresses 707 shown in FIG. 7E (1) result from noise and should be eliminated in order to avoid confusion on the pupil map 705. The intensities at addresses 707 thus are defined as zero, and "z" is replaced by "o" as shown in FIG. 7E (2).

After the transformation the inner curve 743 is formed by a line passing through addresses which have intensities "0" and which are immediately adjacent to the addresses 703, i.e., "a", of the pupil map 705.

In some embodiments, the process to define the inner curve 743 in step 730 is not used. For example, the first segment 715 shown in FIG. 7B is at the edge of the pupil map 705. The first segment region 715 includes the edge region 731, and does not include the edge region 741. Thus, the process to define the inner curve 743 in step 730 is not performed for the first segment 715. In some embodiments, if the round pupil map shown in FIG. 2A, rather than the donut pupil map 705 as shown in FIG. 2B, is used, the process to define the inner curve 743 in step 730 can also be removed from the process flow, because the round pupil map shown in FIG. 2A does not include the edge region 741. One of ordinary skill in the art can readily decide whether to include step 730 based on the shape of the pupil map.

Step 740 is then provided to calculate the effective area of one of the segments 715. Referring to FIG. 7D(2), the number of the first addresses 701 and second addresses 703 within the edge region 731 and the boundary lines 711 is counted as a first number "T". The number of the first addresses 701 within the edge region 731 and the boundary lines 711 is counted as a second number "N". The effective area of the segment 715 is defined as a ratio of the second number "N" divided by the first number "T", i.e., N/T.

Step 750 counts the segments 715 whose effective areas are larger than a first predetermined value. In some embodiments, the first predetermined value is about 0.3. For example, in FIG. 7D (2) the first number "T" is 144 and the second number "N" is 94. The effective area is about 0.65 (94/144) which is larger than 0.3. Thus, the first segment 715 is counted. If the effective area of other segments 715 is less than the predetermined value, e.g., 0.3, the segments 715 would not be counted.

Step 760 determines whether the subsequent process step 770 should be performed. In step 760, if the number of the counted segments 715 is larger than a second predetermined value, step 770 is performed to apply the light source to a photolithographic process. The quality of the light source depends on the number of the counted segments. In some embodiments, the second predetermined value is from about 16 to about 18. In such embodiments, if the number of the counted segments 715 falls within the range from 16 to 18, step 760 is satisfied and the light source is applied to a photolithographic process in step 770 as shown in FIG. 7A. Conversely, if the number of the counted segments 715 does not fall within the range from 16 to 18, step 760 is satisfied and the quality of the light source should be improved as shown in FIG. 3. Under this circumstance, a modified light source is applied and steps 700-760 are repeated to determine the quality of the light source as shown in FIG. 7A.

The present invention may be embodied in the form of computer-implemented processes and apparatus for practicing those processes. The present invention may also be embodied in the form of computer program code embodied in tangible media, such as floppy diskettes, read only memories (ROMs), CD-ROMs, hard drives, "ZIP™" high density disk drives, flash memory drives, or any other computer-readable storage medium, wherein, when the computer program code is loaded into and executed by a computer, the computer becomes an apparatus for practicing the invention. The present invention may also be embodied in the form of computer program code, for example, whether stored in a storage medium, loaded into and/or executed by a computer, or transmitted over some transmission medium, such as over the electrical wiring or cabling, through fiber optics, or via electromagnetic radiation, wherein, when the computer program code is loaded into and executed by a computer, the computer becomes an apparatus for practicing the invention. When implemented on a general-purpose processor, the computer program code segments configure the processor to create specific logic circuits.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of determining a quality of a light source applied to a photolithographic process, comprising the steps of:

exposing an image sensor array to a light from the light source;

collecting addresses and respective intensities corresponding to a plurality of locations on a pupil map representing intensity of the light from the light source on the image sensor array;

defining at least one of an inner curve and an outer curve of the pupil map based upon the collected addresses and respective intensities; and applying the light source to the photolithographic process for forming a device on a semiconductor wafer if at least one of the following conditions is satisfied:

a radius of the inner curve having a distance defined from a center of the pupil map to an address corresponding to about 7.5% of a total sum intensity to about 12.5% of the total sum intensity, the total sum intensity for a given radius calculated as a sum of the collected intensities within the given radius, or the outer curve encloses points corresponding to addresses having between about 87.5% of the total sum intensity and about 92.5% of the total sum intensity.

2. The method of claim 1, wherein the inner curve and the outer curve comprise at least one selected from a group consisting of a circle, an oval and a part of a circle.

3. The method of claim 1, wherein addresses on the inner circle correspond to intensities having equal or proximately equal normalized intensities.

4. The method of claim 3, wherein substantially all of the addresses corresponding to a normalized intensity of about 10% fall within a range between a first circle and a second circle, wherein the first circle encloses a plurality of addresses corresponding to about 7.5% of the total sum intensity, and the second circle encloses a plurality of addresses corresponding to about 12.5% of the total sum intensity.

5. The method of claim 1, wherein addresses on the outer circle correspond to intensities having equal or substantially similar normalized intensities.

6. The method of claim 5, wherein substantially all addresses corresponding to normalized intensity values of about 90% fall within a range between a first circle and a second circle, wherein the first circle encloses a plurality of addresses corresponding to about 87.5% of the total sum intensity, and the second circle encloses a plurality of addresses corresponding to about 92.5% of total sum intensity.

7. The method of claim 1 further comprising:
converting the addresses and the intensities into a three-dimension (3-D) drawing;
defining the inner curve enclosing addresses for which a sum of the intensities is about 10% of the total sum intensity;
defining the outer curve enclosing addresses for which a sum of the intensities is about 90% of the total sum intensity; and
cross-sectioning the 3-D drawing to generate an intensity distribution pattern between the inner curve and the outer curve.

8. The method of claim 7, wherein the intensity distribution pattern is generated by a polynomial regression method.

9. The method of claim 1 further comprising:
converting the addresses and the intensities into a three-dimension (3-D) drawing;
defining the inner curve enclosing addresses for which a sum of the intensities is about 7.5% to about 12.5% of the total sum intensity;
defining the outer curve enclosing addresses for which a sum of the intensities is about 87.5% to about 92.5% of the total sum intensity; and
cross-sectioning the 3-D drawing to generate an intensity distribution pattern between the inner curve and the outer curve.

10. A method of determining a quality of a light source applied to a photolithographic process, comprising the steps of:
exposing an image sensor array to a light from the light source;
collecting addresses and respective intensities corresponding to a plurality of locations on a pupil map representing intensity of the light from the light source on the image sensor array;
adding the collected intensities to calculate a total sum intensity;
defining at least one of an inner curve and an outer curve of the pupil map based upon the collected addresses and respective intensities, wherein the inner circle encloses a plurality of addresses corresponding to about 10% of the total sum intensity, and the outer circle encloses a plurality of addresses corresponding to about 90% of the total sum intensity; and
applying the light source to the photolithographic process for forming a device on a semiconductor wafer if the addresses have a predetermined pattern relative to the inner curve and the outer curve.

11. The method of claim 10, wherein addresses on the inner circle correspond to intensities having equal or proximately equal normalized intensities.

12. The method of claim 11, wherein substantially all addresses corresponding to normalized intensity values of about 10% fall within a range between a first circle and a second circle, wherein the first circle encloses a plurality of addresses corresponding to about 7.5% of the total sum intensity, and the second circle encloses a plurality of addresses corresponding to about 12.5% of the total sum intensity.

13. The method of claim 10, wherein addresses on the outer circle correspond to intensities having equal or proximately equal normalized intensities.

14. The method of claim 13, wherein substantially all addresses corresponding to normalized intensity values of about 90% fall within a range between a first circle and a second circle, wherein the first circle encloses a plurality of addresses corresponding to about 87.5% of the total sum intensity, and the second circle encloses a plurality of addresses corresponding to about 92.5% of total sum intensity.

15. The method of claim 11 further comprising:
converting the addresses and the intensities into a three-dimension (3-D) drawing;
defining the inner curve enclosing addresses for which a sum of the intensities is about 10% of the total sum intensity;
defining the outer curve enclosing addresses for which a sum of the intensities is about 90% of the total sum intensity; and
cross-sectioning the 3-D drawing to generate an intensity distribution pattern between the inner curve and the outer curve by a polynomial regression method.

16. A method of determining a quality of a light source applied to a photolithographic process, comprising the steps of:
exposing an image sensor array to a light from a light source;
collecting addresses and respective intensities corresponding to a plurality of locations on a pupil map representing intensity of the light from the light source on the image sensor array;
defining a plurality of segments on the pupil map, wherein each segment comprises a plurality of addresses and respective normalized intensities;

defining an outer curve on the pupil map;
calculating an effective area of each of the segments;
counting a number of the segments having effective areas that are larger than a first predetermined value; and
applying the light source to a photolithographic process for forming a device on a semiconductor wafer, if the number of the segments having effective areas that are larger than the first predetermined value is larger than a second predetermined value.

* * * * *